(12) United States Patent
Venkitachalam et al.

(10) Patent No.: US 9,634,094 B1
(45) Date of Patent: Apr. 25, 2017

(54) STRAIN-ENHANCED TRANSISTORS WITH ADJUSTABLE LAYOUTS

(71) Applicant: Altera Corporation, San Jose, CA (US)

(72) Inventors: Girish Venkitachalam, San Jose, CA (US); Che Ta Hsu, San Jose, CA (US); Fangyun Richter, San Jose, CA (US); Peter J. McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/181,447

(22) Filed: Feb. 14, 2014

Related U.S. Application Data

(62) Division of application No. 13/040,538, filed on Mar. 4, 2011, now Pat. No. 8,664,725.

(51) Int. Cl.

| | |
|---|---|
| *H01L 23/62* | (2006.01) |
| *H01L 29/10* | (2006.01) |
| *H01L 27/088* | (2006.01) |
| *H01L 29/417* | (2006.01) |
| *H01L 27/32* | (2006.01) |
| *H01L 29/66* | (2006.01) |
| *H01L 27/108* | (2006.01) |

(52) U.S. Cl.
CPC ........ *H01L 29/1054* (2013.01); *H01L 27/088* (2013.01); *H01L 27/10897* (2013.01); *H01L 27/3223* (2013.01); *H01L 29/41758* (2013.01); *H01L 29/6681* (2013.01); *H01L 29/66545* (2013.01)

(58) Field of Classification Search
CPC ............. H01L 27/088; H01L 29/41758; H01L 29/66545; H01L 29/1054; H01L 29/6681; H01L 27/10897; H01L 27/3223
USPC ............... 257/355, 346, 360, 362, 173, 401, 257/E27.11; 361/56
See application file for complete search history.

(56) References Cited

U.S. PATENT DOCUMENTS

| | | |
|---|---|---|
| 7,326,998 B1 | 2/2008 | O et al. |
| 7,468,617 B1 | 12/2008 | Sengupta et al. |
| 7,525,173 B2 | 4/2009 | Yang et al. |
| 7,600,207 B2 | 10/2009 | Moroz et al. |
| 7,767,515 B2 | 8/2010 | Moroz et al. |
| 7,781,277 B2 | 8/2010 | Nguyen et al. |
| 7,851,313 B1 * | 12/2010 | Luo .................. H01L 21/30608 257/19 |

(Continued)

*Primary Examiner* — Shouxiang Hu
(74) *Attorney, Agent, or Firm* — Treyz Law Group, P.C.; G. Victor Treyz; Jason Tsai

(57) ABSTRACT

A transistor may include a semiconductor region such as a rectangular doped silicon well. Gate fingers may overlap the silicon well. The gate fingers may be formed from polysilicon and may be spaced apart from each other along the length of the well by a fixed gate-to-gate spacing. The edges of the well may be surrounded by field oxide. Epitaxial regions may be formed in the well to produce compressive or tensile stress in channel regions that lie under the gate fingers. The epitaxial regions may form source-drain terminals. The edges of the field oxide may be separated from the nearest gate finger edges by a distance that is adjusted automatically with a computer-aided-design tool and that may be larger than the gate-to-gate spacing. Dummy gate finger structures may be provided to ensure desired levels of stress are produced.

7 Claims, 10 Drawing Sheets

(56) References Cited

U.S. PATENT DOCUMENTS

| | | | |
|---|---|---|---|
| 8,664,725 B1* | 3/2014 | Venkitachalam et al. | 257/360 |
| 2007/0170524 A1 | 7/2007 | Liu et al. | |
| 2007/0284618 A1 | 12/2007 | Chang et al. | |
| 2008/0003789 A1 | 1/2008 | Chen et al. | |
| 2009/0134430 A1* | 5/2009 | Abe et al. | 257/208 |
| 2010/0052065 A1* | 3/2010 | Diaz et al. | 257/369 |
| 2010/0193882 A1* | 8/2010 | Hoentschel | H01L 29/165 257/410 |

* cited by examiner

STRAIN-ENHANCED TRANSISTORS WITH ADJUSTABLE LAYOUTS

This application is a division of patent application Ser. No. 13/040,538, filed Mar. 4, 2011, which is hereby incorporated by reference herein in its entirety. This application claims the benefit of and claims priority to patent application Ser. No. 13/040,538, filed Mar. 4, 2011.

BACKGROUND

To improve transistor performance, modern metal-oxide-semiconductor transistors are sometimes formed with strain-inducing epitaxial regions. For example, silicon germanium epitaxial regions can be formed adjacent to the gates in p-channel metal-oxide-semiconductor transistors to create compressive stress in the channels of these transistors. Similarly, silicon carbide epitaxial regions can be formed adjacent to the gates in n-channel metal-oxide-semiconductor transistors to create tensile channel stress. The use of these stress-inducing epitaxial regions enhances carrier mobility and improves transistor performance.

In conventional strained transistor layouts, a regular pattern of gate fingers is formed within a well region. Shallow trench isolation structures form a field oxide that surrounds each well. Near the edges of the shallow trench isolation structures, epitaxial growth may be inhibited, because the presence of the isolation structures tends to starve the epitaxial growth region of silicon. This can lead to incomplete epitaxial regions and inadequate channel stress.

SUMMARY

Computer-aided design tools may be used to optimize the design of strain-enhanced transistors on an integrated circuit while satisfying design constraints. For example, transistor strength may be adjusted by changing the size and layout of stress-inducing epitaxial regions. These changes can be made to a given transistor without making other changes to the given transistor such as well region width changes or changes to the number of gate fingers in a transistor. This allows the strength of the transistor to be locally adjusted while similar transistors remain unchanged.

A transistor may include a rectangular doped silicon well. A number of parallel polysilicon gate fingers may overlap the silicon well. The gate fingers may be electrically connected to form a transistor gate using a conductive path such as a path formed from polysilicon. The polysilicon of the conductive path and gate fingers may be silicided.

Gate fingers for the transistor may be spaced from each other along the length of the well by a fixed gate-to-gate spacing. The edges of the well may be surrounded by field oxide. The field oxide may be formed from shallow trench isolation structures. Epitaxial regions may be formed within the well to produce compressive or tensile stress in the transistor channel regions that lie under the gate fingers. The epitaxial regions may be doped to form source-drain terminals for the transistor.

The edges of the field oxide may be separated from adjacent gate finger edges in the transistor by a distance that can be individually adjusted with the computer-aided-design tool when it is desired to tune the strength of the transistor to satisfy design constraints. This distance may, for example, be larger than the gate-to-gate spacing to ensure that adequate stress is produced under the channels of the outermost gate fingers in the transistor.

In some configurations, dummy finger structures may be provided to ensure desired levels of channel stress are produced. The dummy finger structures may be formed from polysilicon fingers that run parallel to the gate fingers of the gate, but that are electrically isolated from the gate fingers.

Further features of the invention, its nature and various advantages will be more apparent from the accompanying drawings and the following detailed description of the preferred embodiments.

BRIEF DESCRIPTION OF THE DRAWINGS

FIG. 8 is an exemplary graph illustrating stress adjustment by configuring the layout of a transistor in accordance with an embodiment of the present invention.

DETAILED DESCRIPTION

Integrated circuits with metal-oxide-semiconductor transistors are typically formed from silicon substrates. To improve performance, many modern integrated circuits incorporate localized strain-inducing structures. These structures may take the form of regions of epitaxial material such as silicon germanium or silicon carbide.

The lattice constant of silicon germanium is larger than the lattice constant of elemental silicon. As a result, formation of a region of epitaxial silicon germanium adjacent to a transistor channel region will tend to introduce compressive stress into the channel region. Compressive stress can improve performance in p-channel metal-oxide-semiconductor (PMOS) transistors. The lattice constant of silicon carbide is smaller than that of elemental silicon. Thus, formation of a region of silicon carbide adjacent to the channel of a transistor will tend to introduce tensile stress to the channel. The tensile stress can improve performance in n-channel metal-oxide-semiconductor (NMOS) transistors. Other epitaxial materials and stress-inducing structures may be used to created compressive channel stress and tensile channel stress if desired. The use of silicon germanium and silicon carbide epitaxial regions are described herein as an example.

FIGS. 1, 2, 3, and 4 are cross-sectional side views showing fabrication of transistors in accordance with embodiments of the present invention to enhance performance relative to conventional arrangements.

Figure 1:
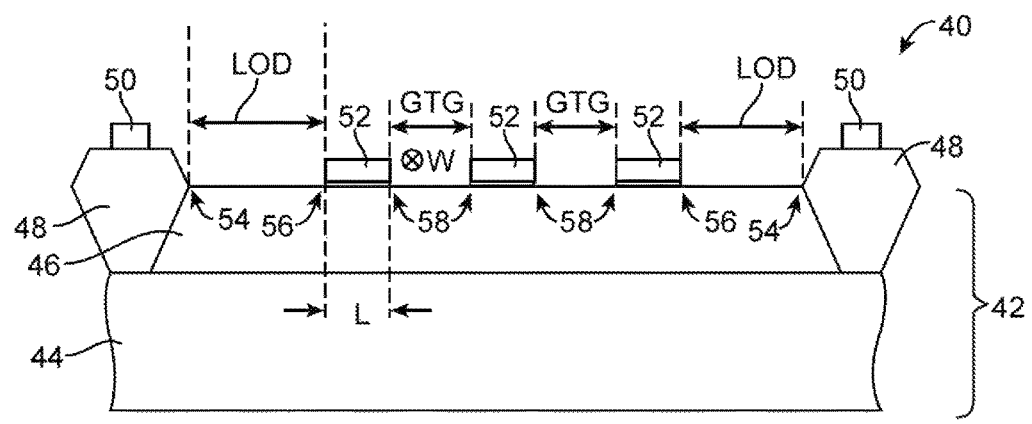
FIG. 1 is a cross-sectional side view of a semiconductor substrate following polysilicon gate formation for an illustrative transistor in accordance with an embodiment of the present invention.

FIG. 1 shows a transistor 40 following formation of gate fingers 52 and shallow trench isolation structures 48. Shallow trench isolation structures 48, which are sometimes referred to as field oxide structures, may be formed from a dielectric such as silicon oxide. Gate fingers 52 may each have a length L (measured horizontally in the orientation of FIG. 1) and a width W (measured into the page in the orientation of FIG. 1). Gate fingers 52 may be formed from a gate material such as polysilicon. The upper surface of the polysilicon may be coated with silicide to enhance conductivity. If desired, other gate finger materials may be used in transistor 40. The use of silicided polysilicon gate fingers is merely illustrative. A layer of gate insulator such as silicon oxide or other dielectric may be formed under each gate finger.

Optional dummy polysilicon structures such as structures 50 may be formed on isolation structures 48 (e.g., to serve as density compliance structures that help satisfy design rules for the semiconductor fabrication process that is used in fabricating transistors such as transistor 40 on an integrated circuit).

Semiconductor substrate 42 may be formed from silicon and may include substrate 44 (e.g., a p-type substrate) and well 46 (e.g., an n-type well when it is desired to form a PMOS transistor or a p-type well when it is desired to form an NMOS transistor). The outer bounds of well 46 may be defined by the inner periphery of the field oxide (i.e., the innermost edges of isolation structures 48). According to embodiments of the present invention, numerous rectangular wells 46 may be associated with numerous transistors 40. Only one transistor is shown in FIG. 1 to avoid overcomplicating the drawing.

In the example of FIG. 1, transistor 40 contains three gate fingers 52. It is appreciated that different transistors may have different numbers of gate fingers. For example, some transistors 40 may have fewer than three gate fingers, more than three gate fingers, more than four gate fingers, more than five gate fingers, etc. Arrangements with three gate fingers are described herein as an example. A conductive path (e.g., a silicided polysilicon path that is formed as an extension to part of gate fingers 52 or other conductive path) such as path 68 may be use to electrically connect gate fingers 52 together to form gate G.

The spacing between edges 58 of respective gate fingers in transistor 40 may sometimes be referred to as gate-to-gate spacing GTG. The spacing between the outermost gate finger edges 56 and the adjacent edges of isolation structures 48 (edges 54 in FIG. 1) is sometimes referred to as a length of diffusion (LOD) spacing (or a field-oxide-edge-to-gate-finger-edge spacing). To accommodate subsequent epitaxial region growth, it may be desirable to fabricate transistors such as transistor 40 of FIG. 1 so that their LOD values are greater in magnitude than their GTG values. If, as an example, GTG is 100 nm, it may be desirable to fabricate transistor 40 so that LOD is 110 nm or more, 120 nm or more, 130 nm or more, 150 nm or more, 200 nm or more, etc.

Figure 2:
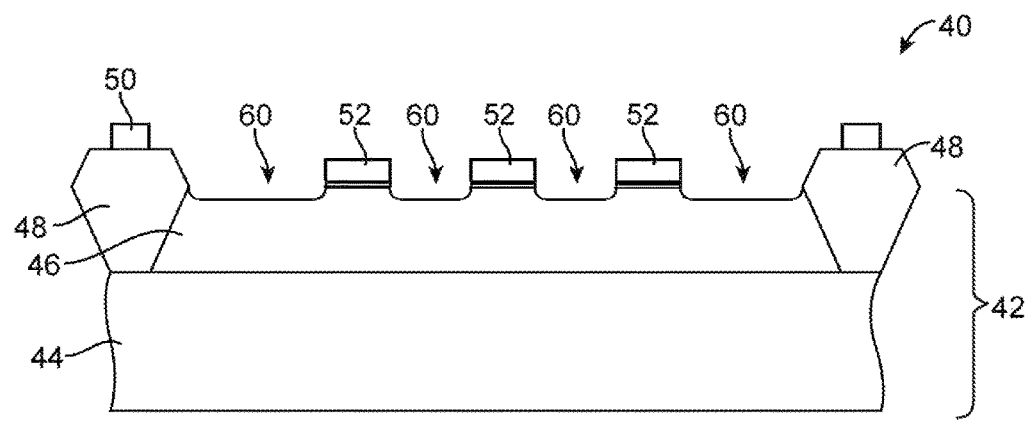
FIG. 2 is a cross-sectional side view of a semiconductor substrate following polysilicon gate formation and etching for an illustrative transistor in accordance with an embodiment of the present invention.

Following formation of polysilicon gate fingers 52 and the other structures of FIG. 1, recesses 60 may be etched in substrate 42 (FIG. 2). Recesses 60 may be etched using dry etching tools or other fabrication equipment.

After recesses 60 have been etched into substrate 42, epitaxial material may be grown on substrate 42 to form local stress-inducing regions for the channel regions under gate fingers 52. Epitaxial materials that may be grown on substrate 42 include (as examples) silicon germanium (to generate compressive channel stress to enhance the performance of PMOS transistors) and silicon carbide (to generate tensile channel stress to enhance the performance of NMOS transistors). It may be desirable to grow the epitaxial material in multiple layers, so that each layer may be provided with a different doping density. This type of arrangement is illustrated in FIGS. 3 and 4.

Figure 3:
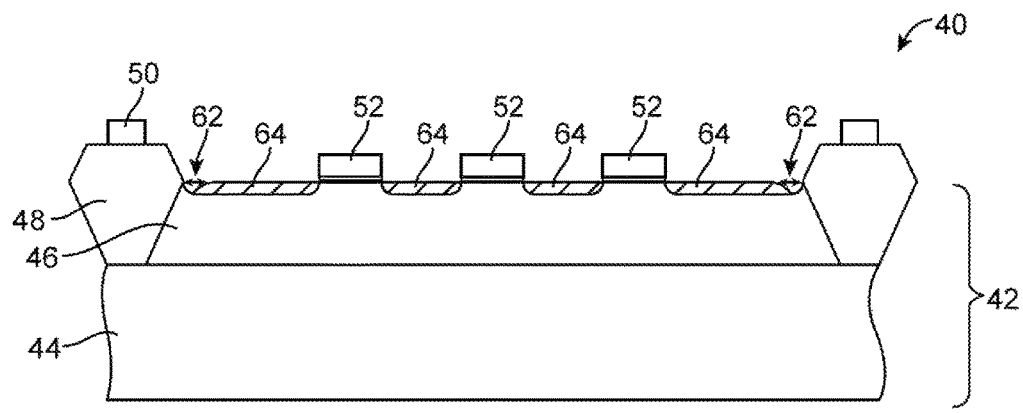
FIG. 3 is a cross-sectional side view of a semiconductor substrate following a first of two epitaxial growth steps in accordance with an embodiment of the present invention.

As shown in FIG. 3, when first (lower) epitaxial layer 64 is grown, gaps 62 may be produced near the interface between the surface of substrate 42 and isolation regions 48 (i.e., because the region near isolation structures 50 is starved of silicon relative to other portions of the surface of substrate 42).

Figure 4:
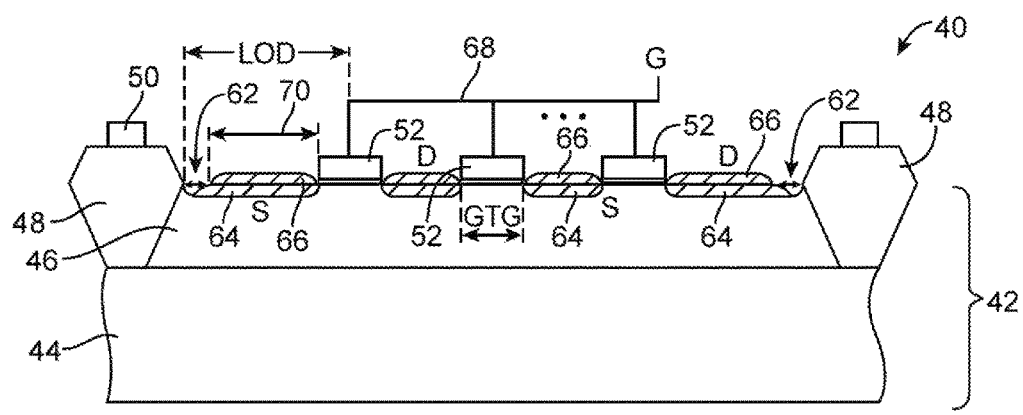
FIG. 4 is a cross-sectional side view of a semiconductor substrate following a second of two epitaxial growth steps to complete formation of doped epitaxial regions in accordance with an embodiment of the present invention.

As shown in FIG. 4, gaps 62 may persist after second (upper) epitaxial layer 66 has been grown on top of lower epitaxial layer 66. Despite the presence of gaps 62, the effective length of the epitaxial region formed from layers 64 and 66 (i.e., length 70 in FIG. 4) can be configured to be at least equal to the magnitude of gate-to-gate spacing GTG because LOD is potentially larger than GTG. By properly configuring the size of LOD relative to GTG, the size of length 70 (i.e., the effective length of the epitaxial region) can be adjusted to ensure that the stress produced in the channel region under each of gate fingers 52 is substantially identical. The reduction in transistor performance that is experienced in conventional transistors due to the variations in channel stress under the outermost gate fingers can therefore be avoided.

In transistor 40 of FIG. 4, the epitaxial growth regions formed from epitaxial layers 64 and 66 form source and drain terminals for transistor 40 (sometimes collectively referred to as source-drains). In FIG. 4, the epitaxial regions that form sources are labeled S (and are electrically connected to each other to form a single source terminal for transistor 40). The epitaxial regions that form drains are labeled D (and are electrically connected to each other to form a single drain terminal for transistor 40). The sources S and drains D along the length of well 46 alternate. In a transistor with more gate fingers, there will be proportionally more sources S and drains D interposed between respective gate fingers.

Figure 5:
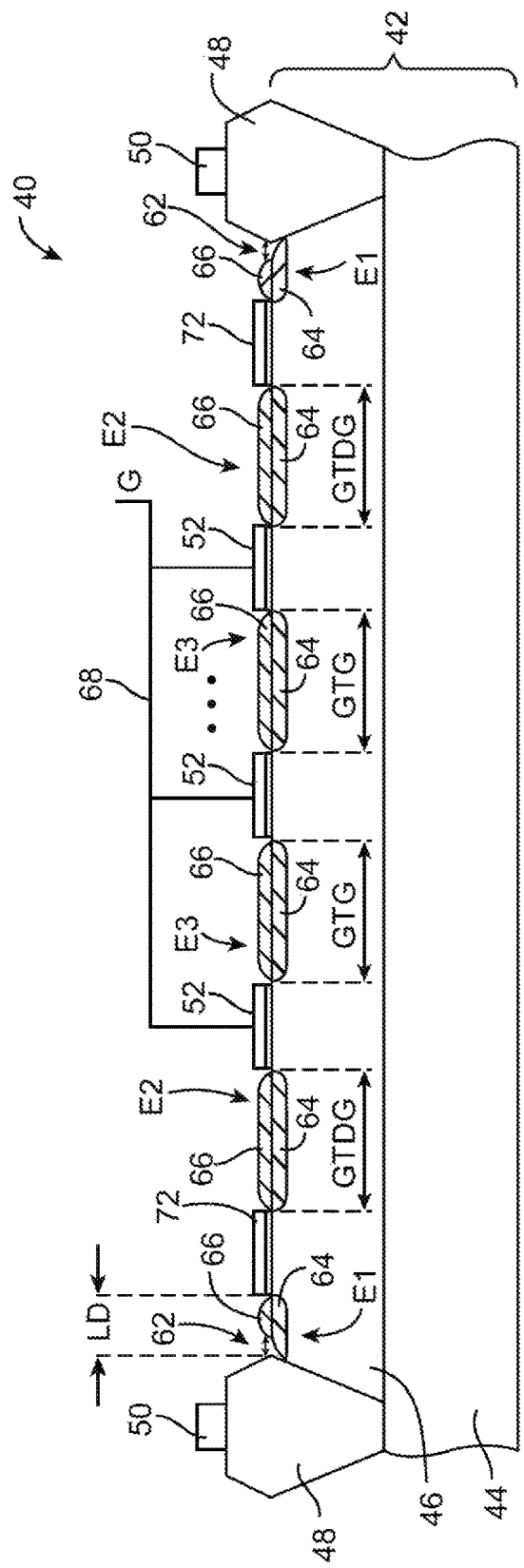
FIG. 5 is a cross-sectional side view of a transistor having dummy gates in accordance with an embodiment of the present invention.

If desired, uniformity in the localized stress that is induced in the channel regions of transistor 40 may be enhanced by incorporating dummy gate fingers into the transistor layout. An arrangement of this type is shown in FIG. 5. As shown in FIG. 5, transistor 40 may have three gate fingers 52. Gate fingers 52 may be separated from each other by lateral gate-to-gate spacing GTG and may be electrically connected to each other by conductive path 68 to form gate terminal G for transistor 40. Transistor 40 may also have dummy gate fingers 72 (sometimes referred to as dummy gate lines, dummy gates, or dummy gate structures). Dummy gate fingers 72 are not electrically connected to gate G (i.e., dummy gate fingers 72 are electrically isolated from each of gate fingers 52). As with gate fingers 52, dummy gate fingers 72 may be formed from silicided polysilicon that covers a layer of gate insulator such as silicon oxide. The width of dummy gate fingers 72 may be the same as the widths of gate fingers 52 (e.g., tens of nanometers or less in a typical design) or may have a different size.

During epitaxial growth, lower epitaxial layer 64 and upper epitaxial layer 66 may be grown within recesses 60 (see, e.g., FIG. 2) on substrate 42. Due to the proximity of isolation regions 48, gaps 62 may form along the edges of the epitaxial material that is interposed between dummy gate fingers 72 and isolation regions 48. This may affect the quality and quantity of the epitaxial material that lies between dummy gate fingers 72 and isolation regions 48 (E1). However, the presence of dummy gate fingers 72 tends to shield the other gate fingers from regions E1.

As shown in FIG. 5, epitaxial material E3 lies between respective gate fingers 52 and has an associated lateral dimension that is defined by gate-to-gate spacing GTG. Epitaxial material E2 lies between the outermost gate fingers 52 in transistor 40 and adjacent dummy gate fingers 72. For example, epitaxial material E2 on the left side of transistor 40 of FIG. 5 lies between the left-hand dummy gate finger 72 and the leftmost gate finger 52, whereas epitaxial material E2 on the right side of transistor 40 lies between the right-hand dummy gate finger 72 and the rightmost gate finger 52.

The size and therefore the amount of stress induced by each of epitaxial structures E2 can be adjusted to be identical to that of epitaxial structures E3. For example, the spacing GTDG between dummy gate fingers 72 and gate fingers 52 can be configured to be the same as gate-to-gate spacing GTG, so the outer gate fingers 52 on the left and right of transistor 40 have the same amount of localized stress in their channel regions as the central gate finger 52. If desired, dummy gate fingers 72 may be moved closer or farther away from the outermost gate fingers 52 to adjust the size of regions E2. These adjustments may be made automatically by a computer-aided design tool as part of the process of creating a layout for an integrated circuit.

Figure 6:
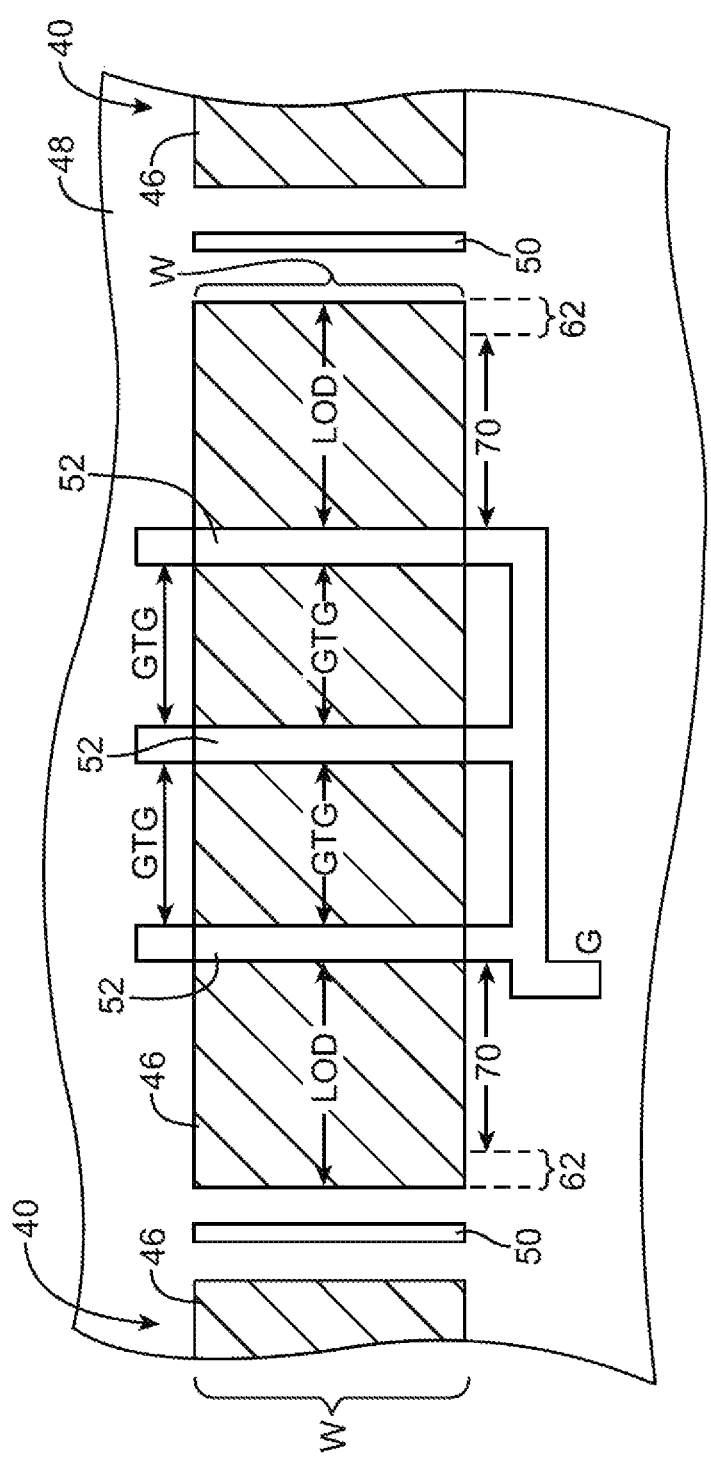
FIG. 6 is a top view of an illustrative transistor such as a transistor of the type shown in FIG. 4 in accordance with an embodiment of the present invention.

FIG. 6 is a top view of a transistor of the type shown in FIG. 4 in which the outermost epitaxial regions have a lateral dimension LOD that is potentially different than gate-to-gate spacing GTG. As shown in FIG. 6, well region 46 (sometimes referred to as a diffusion region) may form part of a row of rectangular well regions for corresponding transistors 40 each of which has the same lateral dimension W (corresponding to the width of each gate finger 52).

When performing layout operations for an integrated circuit, it may be difficult or impossible to adjust W on a transistor-by-transistor basis. Making such adjustments to W may hinder the ability of the computer-aided design (CAD) tools that are performing the layout operations to ensure that surface area on the integrated circuit is used efficiently. If such changes were to be made, the width W of the wells in a row might vary too frequently. Nevertheless, by use of computer-aided-design tools that have knowledge of the impact of changes in the value of LOD on induced channel stress under gate fingers 52, appropriate individualized changes may be made to LOD (e.g., on a transistor-by-transistor basis, or at least with more granularity than would otherwise be possible).

Changes to LOD in one transistor might make it desirable to alter the horizontal placement of other transistor wells 46 in a row of wells 46 (to ensure sufficient field oxide is available between adjacent wells), but this type of change can generally be more readily accommodated in an integrated circuit layout than changes that require alteration of well dimension W in a fraction of the transistors in a row. Moreover, changes to LOD may have less impact than transistor design changes that require addition or removal of an entire gate finger from a given transistor, making LOD adjustments more appropriate than changes to gate finger count when relatively small transistor strength adjustments are desired. By adjusting LOD to adjust the amount of stress under the gate fingers 52 that are adjacent to isolation structures 48, transistor strength may therefore be fine tuned. These fine tuning adjustments may be made when using CAD tools to create a layout for an integrated circuit from a logic design that has been supplied by a logic designer.

Figure 7:
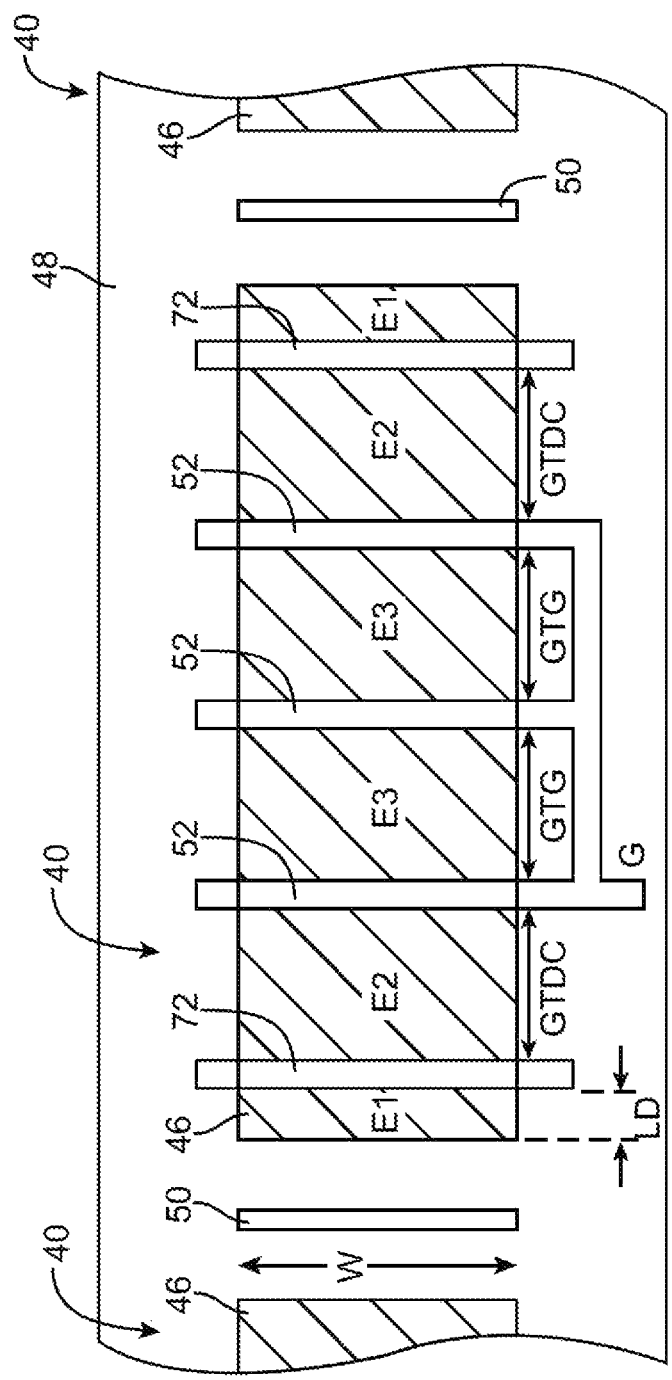

Transistor performance can also be adjusted by controlling the use and placement of dummy gate fingers and the separation between gate fingers. FIG. 7 is a top view of an illustrative transistor of the type shown in FIG. 5 that has dummy gate fingers 72. As shown in FIG. 7, adjustments to the gate-to-dummy-gate distance GTDG in transistor 40 will change the width LD of the epitaxial material in region E1. The size of LD may, for example, be in the range of 0 to GTDG or may be more than GTDG. Smaller values of LD may be used to conserve space. The size of GTDG may be the same as that of GTG to ensure that the stress produced on the channel that lies between E2 and E3 is the same as the stress produced on the channel that lies between E3 and E3.

Figure 8:
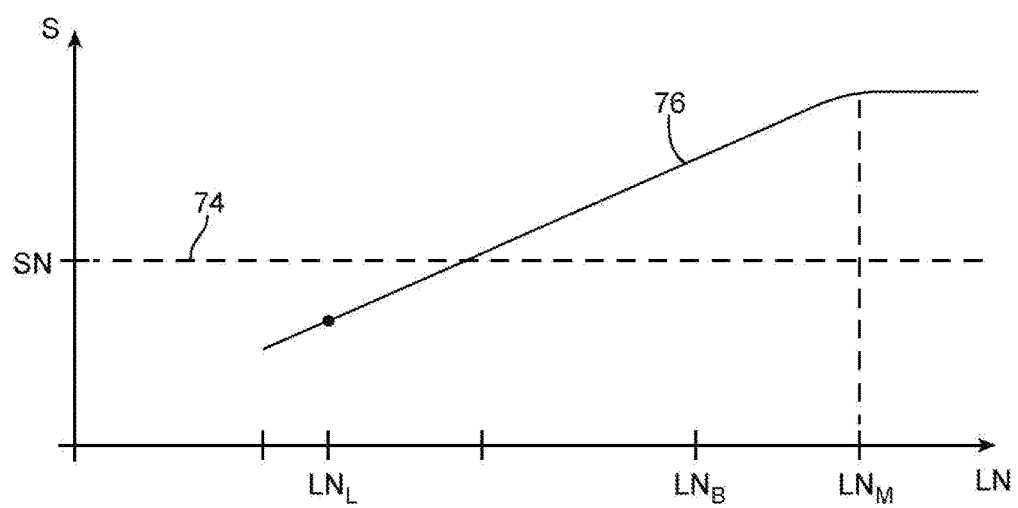
FIG. 8 is a top view of an illustrative transistor having dummy gate structures such as a transistor of the type shown in FIG. 5 in accordance with an embodiment of the present invention.

FIG. 8 is an exemplary graph for illustrating stress variation S as a function of the lateral dimension LN of the epitaxial regions in transistor 40. Dimension LN may correspond to dimension GTDG and/or GTG in FIG. 7 or dimension LOD (i.e., dimension 70) or GTG in FIG. 6 (as examples). Stress S may correspond to compressive stress (e.g., when the epitaxial material is silicon germanium) or tensile stress (when the epitaxial material is silicon carbide). The amount of stress S increases as the lateral dimension LN increases. At relatively large sizes (e.g., above dimension $LN_M$ in the example of FIG. 8), the amount of stress that is produced on the transistor channel tends to saturate, so that further increases in LN will not produce significantly more stress. Below size $LN_M$, stress S generally increases or decreases with corresponding increases or decreases in LN.

When an epitaxial region such as region E3 between gate fingers 52 has a particular size (GTG), a desired nominal amount of stress SN may be produced. If gaps 24 are too large in a conventional design, the effective size of the outermost epitaxial regions will decrease (e.g., to $LN_L$) and stress S will drop below the desired value of SN. With designs of the type shown in FIG. 6 and FIG. 7, the size of the outer epitaxial regions can be adjusted (e.g., by adjusting LOD to adjust dimension 70 and by adjusting GTDG). If desired, LOD may be set to a value that is larger than GTG so that dimension 70 equals GTG or GTDG may be set to be equal to GTG to ensure that stress level SN is produced in all of the channel regions in the transistor. In some situations, it may desirable (at least for some transistors) to increase stress further by enlarging LOD and dimension 70 (for the transistor of FIG. 6) or GTDG (for the transistor of FIG. 7) to a higher value (e.g., value $LN_B$). This will create additional stress (compressive for PMOS or tensile for NMOS) and will increase transistor strength beyond the nominal value that would be achieved if the transistor components were sized only to produce nominal stress value SN.

Figure 9:
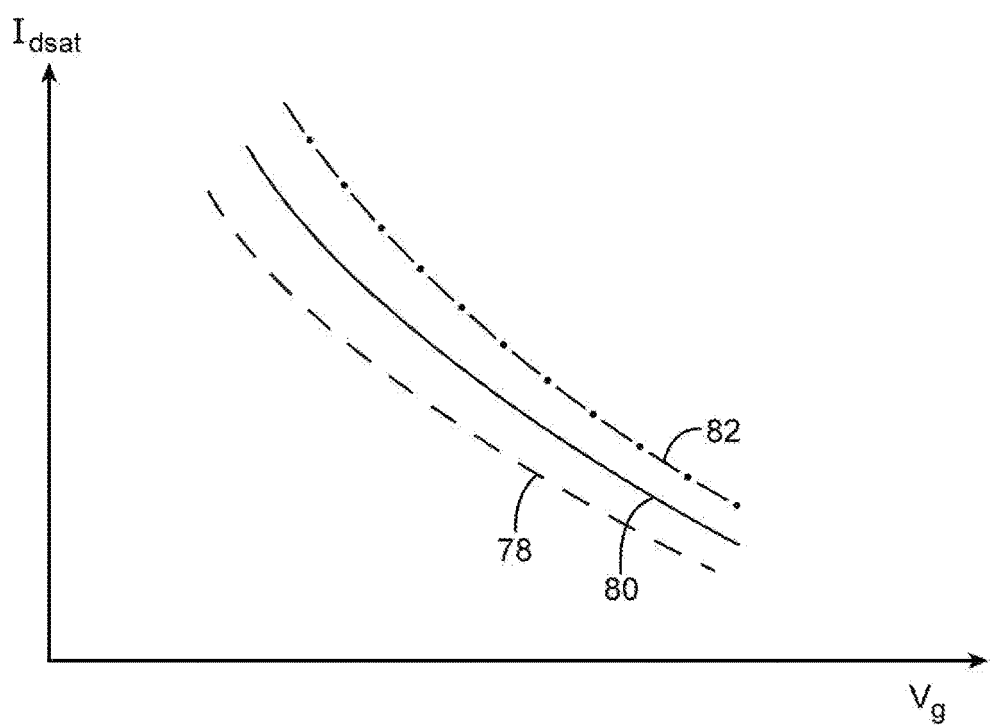
FIG. 9 is an exemplary graph illustrating transistor performance adjustment by adjusting stress in channel regions of the transistor using transistor adjustments of the type illustrated in FIG. 8 in accordance with an embodiment of the present invention.

FIG. 9 is an exemplary graph illustrating the impact stress adjustments in transistors 40. In the graph of FIG. 9, dashed line 78 shows transistor currents Idsat that are produced as a function of gate voltage Vg for a conventional transistor without localized stress. By adding epitaxial regions adjacent to the gate fingers of the transistor, stress may be produced in the channel region of the transistor that increases Idsat, as shown by solid line 80. Solid line 80 may, for example, correspond to a balanced transistor of the type shown in FIG. 7 in which dummy gate fingers 72 have been provided to ensure that the stress produced by epitaxial material E2 is equal to the stress produced by epitaxial material E3 or may correspond to a transistor of the type shown in FIG. 6 in which dimension 70 matches dimension GTG.

In some portions of an integrated circuit, it may be desirable to enhance the strength of a transistor without increasing its width W or the number of gate fingers 54. For example, a logic design may dictate that numerous transistors be formed from a row of wells 46 that each have the same width W. In this type of arrangement, it might be impractical to make a local modification to a mask layout to allow some transistors to have a width W' that is slightly larger than width W. At the same time, the additional strength that is required for these transistors may be insufficient to justify the addition of an entire additional gate finger 52 to each of these transistors. When criteria such as these are satisfied, an optimal solution may involve locally increasing LOD and dimension 70 (for a transistor of the type shown in FIG. 6) or GTDG (for a transistor of the type shown in FIG. 7) to increase transistor channel stress (at least for the outermost gate fingers that are adjacent to the LOD epitaxial material or GTDG epitaxial material). This local increase in epitaxial region size may, for example, result in an increase of Idsat to the values shown by dashed-and-dotted line 82 of FIG. 9.

Figure 10:
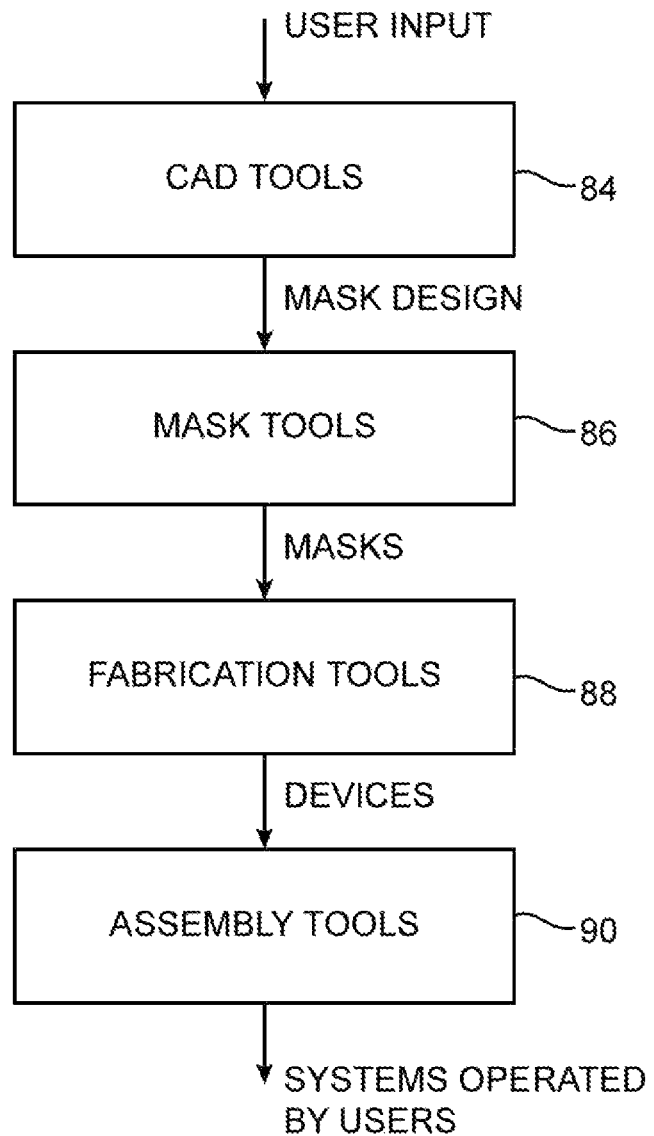
FIG. 10 is an exemplary diagram of illustrative tools used in designing and operating integrated circuits with optimized transistors in accordance with an embodiment of the present invention.

Illustrative equipment that may be used in designing and fabricating integrated circuits with transistors 40 having individually adjustable LOD sizes and/or adjustable dummy gate fingers and dummy gate finger locations are shown in FIG. 10.

As shown in FIG. 10, CAD tools 84 may receive a logic design from a logic designer as input. CAD tools 84 may be implemented on computing equipment formed from one or more computers (e.g., networked computers). A logic designer may supply input by entering design code using a design editor, by retrieving design data from a library, by using design entry wizards, or using other design entry tools in CAD tools 84.

CAD tools 84 may produce a mask design as an output in response to processing the logic design input. In producing the layout of the transistors that are embodied in the mask design, CAD tools 84 may automatically make transistor size adjustments (e.g., adjustments to LOD, dimension 70, GTDG, GTG, etc.) that adjust stress S (FIG. 8) and thereby adjusted Idsat (FIG. 9) of transistors 40 for optimum performance. The design decisions that are made by tool 84 may automatically make tradeoffs to optimize multiple design criteria simultaneously (e.g., to reduce overall circuit area, to satisfy timing constraints, to ensure leakage current for individual transistors and for the entire integrated circuit are satisfactory, to ensure that semiconductor fabrication design rules are satisfied, etc.).

The mask design may be converted into a mask set by mask tools 86. Masks from mask tools 86 may be used by semiconductor fabrication tools 88 (e.g., photolithography tools and associated processing tools) to fabricate integrated circuits. The fabricated devices can be mounted on printed circuit boards and assembled using tools 90 to form finished systems that are operated by users.

Figure 11:
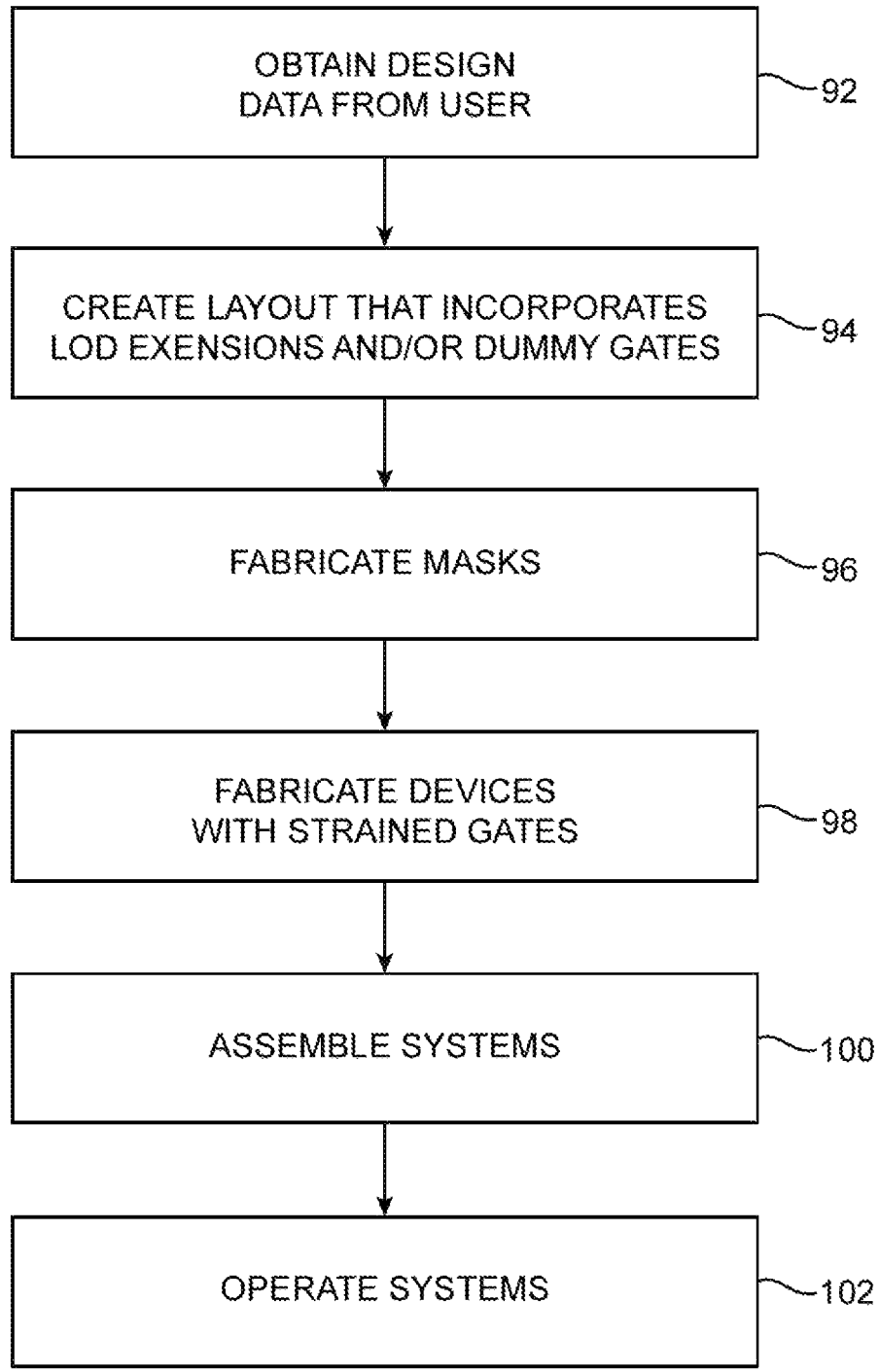
FIG. 11 is an exemplary flow chart for designing and operating integrated circuits with optimized transistors using equipment of the type shown in FIG. 10 in accordance with an embodiment of the present invention.

A flow chart of illustrative steps involved in designing, fabricating, and using an integrated circuit containing one or more transistors such as transistors 40 with adjustable epitaxial regions and/or dummy gate fingers that produce desired amounts of localized channel stress is shown in FIG. 11.

At step 92, a circuit design may be obtained from a circuit designer using CAD tools 84 (FIG. 10). The circuit design may include circuits for audio processing, video processing, communications, memory management, data processing, etc. The circuit design may include design constraints on timing, power consumption, area, voltages, currents, logic functionality, etc.

At step 94, CAD tools 84 may create device layout (i.e., a layout for a set of photolithographic masks), e.g., an optimum, that satisfies the design constraints that were gathered during the operations of step 92 and associated semiconductor fabrication design rules. In some situations, CAD tools 84 may automatically make localized adjustments to transistors 40 to adjust the stress in their channel regions as described in connection with FIGS. 6 and 7. These adjustments may involve, for example, creating a mask layout with the computer-aided design tool that includes a layout for a given (locally adjusted) transistor with a field-oxide-edge-to-gate-finger-edge spacing that is different from other transistors on the same integrated circuit.

As described in connection with the rows of identical-width wells in transistors 40 of FIGS. 6 and 7, the locally adjusted transistor (e.g., the central transistor of FIG. 6 or the central transistor of FIG. 7 as an example) may have the same width W as the other transistors 40 in the same row (i.e., the transistors having wells 46 to the left and right of the central wells 46 of FIGS. 6 and 7) and may have identical gate finger counts (e.g., three gate fingers each). The locally adjusted field-oxide-edge-to-gate-finger-edge spacing in the given transistor may be used to satisfy design constraints without the need to make undesirable adjustments such as global changes to the width of wells 46 in the same row of wells 46 or gate finger count adjustments.

At step 96, mask fabrication tools 88 (FIG. 10) may be used to create photolithographic masks that include the layout produced by the CAD tools.

At step 98, semiconductor fabrication tools 88 (FIG. 10) may be used to fabricate integrated circuits that include stress-inducing epitaxial structures using the layouts embodied in the masks from tools 86.

At step 100, the devices may be assembled to form systems. For example, packaged integrated circuits may be mounted on a printed circuit board and installed within an electronic device.

At step 102, a user may operate the electronic device and the transistors 40 within the integrated circuit in the device.

Figure 12:
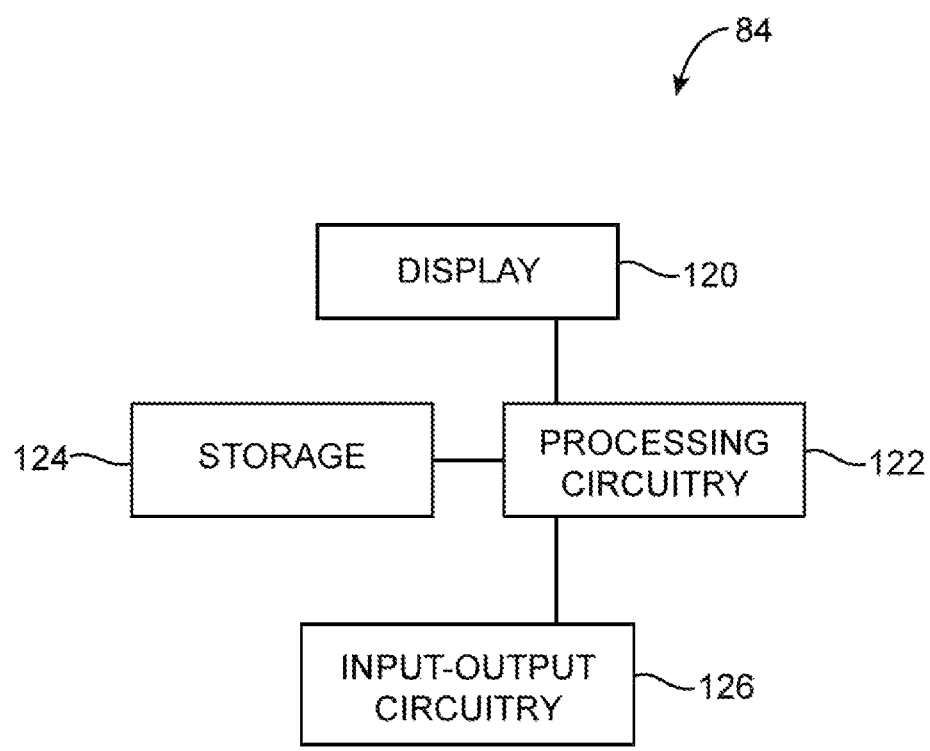
FIG. 12 is an exemplary diagram of illustrative computer aided design tools that may be used in designing integrated circuits with optimized transistors in accordance with an embodiment of the present invention.

FIG. 12 is an exemplary diagram of illustrative computing equipment that may be used in implementing computer-aided design tools 84. Equipment 84 may include one or more networked computers running computer-aided design tool code. As shown in FIG. 12, equipment 84 may include processing circuitry 122. Processing circuitry 122 may include one or more microprocessors, digital signal processors, microcontrollers, application-specific integrated circuits, programmable integrated circuits, or other processing components. Processing circuitry 122 may execute code that is stored on storage 124. Data to be processed and resulting processed data may also be stored on storage 124. Storage 124 may include volatile and non-volatile memory, hard-disk drives, removable storage media, random-access memory, flash memory, solid state drives, or other storage circuitry. Data (e.g., output from a processing operation) may be displayed on display 120 and/or may be electronically transmitted through a network using communications circuitry in input-output circuitry 126. Input-output circuitry 126 may also include keyboards, computer mice, and other user interface components for receiving user input.

The foregoing is merely illustrative of the principles of this invention and various modifications can be made by those skilled in the art without departing from the scope and spirit of the invention.

What is claimed is:

1. A transistor comprising:
    a semiconductor region having a plurality of transistor channel regions;
    gate fingers that overlap that semiconductor region, wherein each gate finger lies above a respective transistor channel region in the plurality of transistor channel regions, and wherein the gate fingers are coupled together to form a gate;
    isolation structures that surround the semiconductor region, wherein one of the isolation structures has an edge that is separated from an edge of an adjacent one of the gate fingers by a distance without any intervening gate structures therebetween, and wherein the gate fingers have adjacent edges that are separated from each other by a gate-to-gate spacing that is less than the distance;
    an entirety of dummy gate structures formed on the isolation structures; and
    an epitaxial region that is formed in the distance between the adjacent one of the gate fingers and the one of the isolation structures and that generates stress in a corresponding transistor channel region of the plurality of transistor channel regions.

2. The transistor defined in claim 1, wherein the semiconductor region comprises a rectangular well region, and wherein the gate fingers comprise at least three parallel polysilicon gate fingers that overlap the rectangular well region.

3. The transistor defined in claim 2, wherein the channel regions are free of silicon germanium, and wherein the epitaxial regions comprise silicon germanium.

4. The transistor defined in claim 2, wherein the channel regions are free of silicon carbide, and wherein the epitaxial regions comprise silicon carbide.

5. The transistor defined in claim 1, wherein the semiconductor region comprises an n-type well.

6. The transistor defined in claim 1, wherein the semiconductor region comprises a p-type well.

7. The transistor defined in claim 1, wherein the semiconductor region comprises a rectangular well, and wherein the isolation structures comprise silicon oxide that surrounds the rectangular well.

* * * * *